US010884029B2

(12) United States Patent
Shimizu

(10) Patent No.: US 10,884,029 B2
(45) Date of Patent: Jan. 5, 2021

(54) MAGNETIC SENSOR AND ELECTRIC CURRENT SENSOR INCLUDING SAME

(71) Applicant: Murata Manufacturing Co., Ltd., Nagaokakyo (JP)

(72) Inventor: Yasuhiro Shimizu, Nagaokakyo (JP)

(73) Assignee: MURATA MANUFACTURING CO., LTD., Kyoto (JP)

(*) Notice: Subject to any disclaimer, the term of this patent is extended or adjusted under 35 U.S.C. 154(b) by 284 days.

(21) Appl. No.: 16/152,589

(22) Filed: Oct. 5, 2018

(65) Prior Publication Data

US 2019/0041432 A1 Feb. 7, 2019

Related U.S. Application Data

(63) Continuation of application No. PCT/JP2017/003558, filed on Feb. 1, 2017.

(30) Foreign Application Priority Data

Jul. 6, 2016 (JP) .................................. 2016-134136

(51) Int. Cl.
G01R 15/20 (2006.01)
G01R 33/09 (2006.01)
H01L 43/08 (2006.01)
G01R 19/00 (2006.01)

(52) U.S. Cl.
CPC ............ *G01R 15/20* (2013.01); *G01R 33/09* (2013.01); *G01R 33/091* (2013.01); *G01R 33/093* (2013.01); *H01L 43/08* (2013.01); *G01R 15/207* (2013.01); *G01R 19/0092* (2013.01)

(58) Field of Classification Search
CPC ................................ G01R 15/20; G01R 33/09
See application file for complete search history.

(56) References Cited

U.S. PATENT DOCUMENTS 7,977,935 B2 * 7/2011 Stuve .................... G01D 5/145
324/207.24
2004/0174164 A1 9/2004 Ao
2005/0054120 A1 3/2005 Wakui et al.

FOREIGN PATENT DOCUMENTS

| JP | 52-41523 A | 3/1977 |
| JP | 2004-264205 A | 9/2004 |
| JP | 2005-183614 A | 7/2005 |
| JP | 2013-242301 A | 12/2013 |
| JP | 2015-049184 A | 3/2015 |

OTHER PUBLICATIONS

Official Communication issued in International Patent Application No. PCT/JP2017/003558, dated Apr. 4, 2017.

* cited by examiner

Primary Examiner — Walter L Lindsay, Jr.
Assistant Examiner — Milton Gonzalez
(74) Attorney, Agent, or Firm — Keating & Bennett, LLP

(57) ABSTRACT

An electric current sensor includes at least one permanent magnet and at least one magnetosensitive body that detects a to-be-measured magnetic field in a state in which a bias magnetic field is applied thereto from the permanent magnet. The permanent magnet is shaped such that the value of a permeance coefficient obtained when taking the application direction of the to-be-measured magnetic field as the magnetization direction is less than or equal to about 1.5 times the value of the permeance coefficient in a magnetization direction of the permanent magnet.

19 Claims, 7 Drawing Sheets

MAGNETIC SENSOR AND ELECTRIC CURRENT SENSOR INCLUDING SAME

CROSS REFERENCE TO RELATED APPLICATIONS

This application claims the benefit of priority to Japanese Patent Application No. 2016-134136 filed on Jul. 6, 2016 and is a Continuation Application of PCT Application No. PCT/JP2017/003558 filed on Feb. 1, 2017. The entire contents of each application are hereby incorporated herein by reference.

BACKGROUND OF THE INVENTION

1. Field of the Invention

The present invention relates to a magnetic sensor and to an electric current sensor that includes the magnetic sensor.

2. Description of the Related Art

Japanese Unexamined Patent Application Publication No. 2013-242301 discloses an electric current sensor that includes a sensor substrate, which is obtained by forming electromagnetic conversion elements on a semiconductor substrate, and a bias magnet. In the electric current sensor disclosed in Japanese Unexamined Patent Application Publication No. 2013-242301, the sensor substrate is mounted on a front surface of a mounting substrate and the bias magnet is mounted on a rear surface of the mounting substrate.

In the case in which there are variations in the application direction and strength of a bias magnetic field applied to an electromagnetic conversion element from a permanent magnet, which serves as a bias magnet, the output of the magnetic sensor varies and there is a decrease in the accuracy with which an electric current that is to be measured is detected.

SUMMARY OF THE INVENTION

Preferred embodiments of the present invention provide magnetic sensors in each of which the stability of the magnetic characteristics of a permanent magnet, which defines and functions as a bias magnet, are secured and a reduction in the detection accuracy of the magnetic sensor is thus reduced or prevented, and electric current sensors that each include the magnetic sensor.

A magnetic sensor based according to a preferred embodiment of the present invention measures the strength of a magnetic field to be measured. The magnetic sensor includes at least one permanent magnet and at least one magnetosensitive body that detects a magnetic field to be measured in a state in which a bias magnetic field is applied to the magnetosensitive body from the permanent magnet. The permanent magnet is shaped such that the value of a permeance coefficient obtained when taking the application direction of the magnetic field to be measured as the magnetization direction is less than or equal to about 1.5 times the value of the permeance coefficient in the magnetization direction of the permanent magnet.

In a magnetic sensor based according to a preferred embodiment of the present invention, the permanent magnet is shaped such that the value of the permeance coefficient obtained when taking the application direction of the magnetic field to be measured as the magnetization direction is less than or equal to the value of the permeance coefficient in the magnetization direction of the permanent magnet.

In a magnetic sensor based according to a preferred embodiment of the present invention, the permanent magnet is shaped such that the value of the permeance coefficient obtained when taking the application direction of the magnetic field to be measured as the magnetization direction is less than or equal to about 0.6 times the value of the permeance coefficient in the magnetization direction of the permanent magnet.

In a magnetic sensor based according to a preferred embodiment of the present invention, the permanent magnet is shaped such that the value of the permeance coefficient in the magnetization direction of the permanent magnet is larger than about 2.

In a magnetic sensor based according to a preferred embodiment of the present invention, the permanent magnet is shaped such that the value of the permeance coefficient in the magnetization direction of the permanent magnet is greater than or equal to the value of the permeance coefficient in the magnetization direction corresponding to the maximum energy product of the demagnetization curve of the permanent magnet.

In a magnetic sensor based according to a preferred embodiment of the present invention, the at least one permanent magnet includes a plurality of permanent magnets. Magnetic fields applied from a group of the permanent magnets among the plurality of permanent magnets are applied to the remaining permanent magnets among the plurality of permanent magnets in the magnetization directions of the remaining permanent magnets. Magnetic fields applied from the remaining permanent magnets are applied to the group of permanent magnets in the magnetization directions of the group of permanent magnets.

An electric current sensor according to a preferred embodiment of the present invention includes a conductor in which a current to be measured flows and that has a length direction; and the magnetic sensor that detects the magnetic field to be measured generated as a result of the current to be measured flowing in the conductor. The magnetization direction of the permanent magnet is a different direction from a direction that is perpendicular or substantially perpendicular to the length direction.

In an electric current sensor according to a preferred embodiment of the present invention, the magnetization direction of the permanent magnet extends in the length direction.

According to preferred embodiments of the present invention, a reduction in the detection accuracy of a magnetic sensor and an electric current sensor equipped with the magnetic sensor is reduced or prevented by securing the stability of the magnetic characteristics of a permanent magnet serving as a bias magnet.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
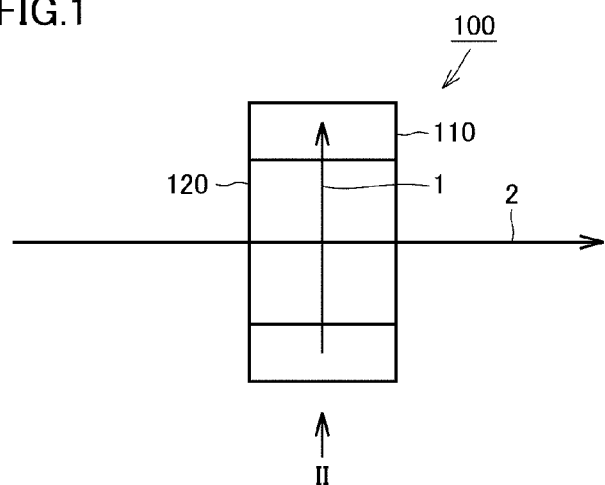
FIG. 1 is a plan view illustrating the configuration of a magnetic sensor according to preferred embodiment 1 of the present invention.

Hereinafter, magnetic sensors according to preferred embodiments of the present invention and electric current sensors that each include a magnetic sensor according to a preferred embodiment of the present invention will be described with reference to the drawings. In the following description of the preferred embodiments, identical or equivalent components and elements in the drawings are denoted by the same symbols and repeated description thereof is omitted.

Preferred Embodiment 1

Figure 2:
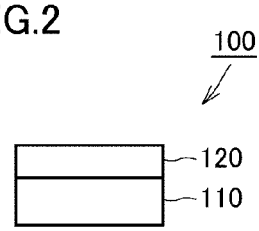
FIG. 2 is a front view of the magnetic sensor illustrated in FIG. 1 seen in the direction of arrow II.

FIG. 1 is a plan view illustrating the configuration of a magnetic sensor according to preferred embodiment 1 of the present invention. FIG. 2 is a front view of the magnetic sensor illustrated in FIG. 1 seen in the direction of arrow II.

As illustrated in FIGS. 1 and 2, a magnetic sensor 100 according to preferred embodiment 1 of the present invention includes at least one permanent magnet 110 and at least one magnetosensitive body 120 that detects a magnetic field to be measured in a state in which a bias magnetic field is applied thereto from the permanent magnet 110. In the present preferred embodiment, preferably, one magnetosensitive body 120 is provided on one permanent magnet 110. However, the positional relationship between the magnetosensitive body 120 and the permanent magnet 110 is not limited to this example. In addition, a plurality of either or both of the magnetosensitive body 120 and the permanent magnet 110 may be provided.

The permanent magnet 110 and the magnetosensitive body 120 are bonded to each other with an adhesive. Individual magnetic sensor 100 units may be provided by adhering a permanent magnet 110 and a magnetosensitive body 120 to each other using an adhesive or an adhesive sheet and then dividing the resulting body into individual units using a dicer.

The magnetic sensor 100 may preferably be packaged in a resin package or may be potted using silicone resin, epoxy resin, or other suitable material. Constant current driving, pulse driving, or other suitable driving methods may be appropriately selected as the method of driving the magnetic sensor 100.

In the present preferred embodiment, the magnetosensitive body 120 preferably includes, for example, a Wheatstone-bridge circuit including four anisotropic magnetoresistance (AMR) elements. The magnetosensitive body 120 may instead have a half-bridge circuit including two magnetoresistance elements. Alternatively, the magnetosensitive body 120 may include only one magnetoresistance element and a bridge circuit may be provided by electrically connecting a plurality of such magnetosensitive bodies 120 to each other. In addition, instead of AMR elements, the magnetosensitive body 120 may include magnetoresistance elements, such as giant magnetoresistance (GMR) elements, tunnel magnetoresistance (TMR) elements, ballistic magnetoresistance (BMR) elements, colossal magnetoresistance (CMR) elements, and other suitable elements.

In the present preferred embodiment, the AMR elements include barber pole electrodes and therefore have odd function input/output characteristics. Specifically, the magnetoresistance elements of the magnetosensitive body 120 include barber pole electrodes, and consequently are each biased such that a current flows in a direction at a prescribed angle with respect to the magnetization direction of a magnetoresistance film of the magnetoresistance element.

The magnetoresistance film is preferably made of a magnetic material, such as permalloy, for example. The magnetoresistance film is formed using a sputtering device, a vapor deposition device, or other suitable device. The magnetization direction of the magnetoresistance film is determined by at least either of the application direction of the bias magnetic field applied from the permanent magnet 110 arranged close to the magnetoresistance film and the shape anisotropy of the magnetoresistance film. For example, in the case in which the aspect ratio of the planar shape of the magnetoresistance film is small, the effect of the shape anisotropy of the magnetoresistance film is small, and the magnetization direction of the magnetoresistance film is mainly determined by the application direction of the bias magnetic field applied from the permanent magnet 110. In the case in which the shape anisotropy of the magnetoresistance film is large, the shape anisotropy of the magnetoresistance film has a large effect on the magnetization direction of the magnetoresistance film.

Figure 3:
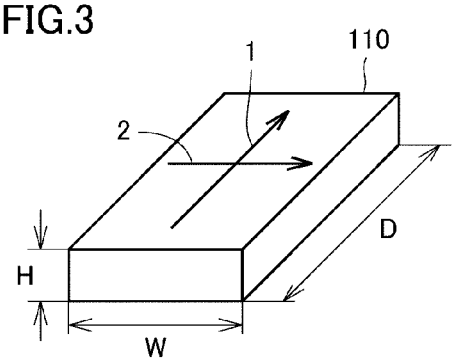
FIG. 3 is a perspective view illustrating the shape of a permanent magnet of the magnetic sensor according to preferred embodiment 1 of the present invention.

FIG. 3 is a perspective view illustrating the shape of the permanent magnet of the magnetic sensor according to preferred embodiment 1 of the present invention. As illustrated in FIG. 3, in the present preferred embodiment, the permanent magnet 110 preferably has a rectangular or substantially rectangular parallelepiped outer shape having a length D, a width W, and a height H, for example.

An isotropic ferrite, an anisotropic ferrite, samarium cobalt, alnico, neodymium, or other suitable material, for example, may preferably be used as the material of the permanent magnet 110. In the case in which an anisotropic ferrite, samarium cobalt, or neodymium is used as the material of the permanent magnet 110, the coercivity of the permanent magnet 110 may be made large, and therefore the stability of the magnetic characteristics of the permanent magnet 110 is able to be increased. The permanent magnet 110 may be a sintered magnet or a bonded magnet.

As illustrated in FIGS. 1 and 3, a magnetization direction 1 of the permanent magnet 110 extends in the length direction of the permanent magnet 110. Therefore, in the present preferred embodiment, the bias magnetic field is applied to the magnetosensitive body 120 in a direction along the magnetization direction 1 of the permanent magnet 110. In the present preferred embodiment, the application direction of a to-be-measured magnetic field 2 applied to the magnetosensitive body 120 preferably extends in the width direction of the permanent magnet 110 and is perpendicular or substantially perpendicular to the magnetization direction 1 of the permanent magnet 110. However, it is sufficient that the application direction of the to-be-measured magnetic field 2 applied to the magnetosensitive body 120 and the magnetization direction 1 of the permanent magnet 110 are different from each other, and the application direction of the to-be-measured magnetic field 2 applied to the magnetosensitive body 120 and the magnetization direction 1 of the permanent magnet 110 may intersect each other at an angle other than about 90°.

By arranging the magnetic sensor 100 in the manner described above, the to-be-measured magnetic field 2 having a different direction from the magnetization direction 1 is applied to the permanent magnet 110.

Consequently, in the case in which the magnetic characteristics of the permanent magnet 110 vary, the detection accuracy of the magnetic sensor 100 will decrease. In other words, in the case in which either or both of the magnetization direction and the magnetization amount of the permanent magnet 110 are changed by the application of the to-be-measured magnetic field 2, either or both of the application direction and the magnetization amount of the bias magnetic field applied to the magnetosensitive body 120 will change, and therefore, the accuracy with which the to-be-measured magnetic field is detected will be reduced.

Accordingly, in the magnetic sensor 100 according to the present preferred embodiment, the permanent magnet 110 is preferably shaped such that the value of a permeance coefficient obtained when taking the application direction of the to-be-measured magnetic field 2 as the magnetization direction is less than or equal to the value of the permeance coefficient in the magnetization direction 1 of the permanent magnet 110.

The higher the value of the permeance coefficient becomes, the easier it is for the permanent magnet 110 to be magnetized. It is preferable that the permanent magnet 110 be shaped such that the value of the permeance coefficient in the magnetization direction 1 of the permanent magnet 110 be larger than about 2, for example.

Next, an experimental example will be described in which the effect of the relationship between the value of the permeance coefficient obtained when taking the application direction of the to-be-measured magnetic field 2 as the magnetization direction and the value of the permeance coefficient in the magnetization direction 1 of the permanent magnet 110 on the ease with which the magnetization direction of the permanent magnet 110 is changed was verified.

In this experimental example, an experiment was performed for four different permanent magnet samples. The material of the permanent magnets of Samples 1 to 4 was an anisotropic ferrite.

TABLE 1

| | Length D (mm) | Width (W) (mm) | Thickness H (mm) | Permeance Coefficient P1 | Permeance Coefficient P2 | P2/P1 |
|---|---|---|---|---|---|---|
| Sample 1 | 2.0 | 1.0 | 0.5 | 12.29 | 2.95 | 0.24 |
| Sample 2 | 2.0 | 1.6 | 0.5 | 8.83 | 5.55 | 0.63 |
| Sample 3 | 2.0 | 2.4 | 0.5 | 6.66 | 9.75 | 1.46 |
| Sample 4 | 2.0 | 3.0 | 0.5 | 5.71 | 13.37 | 2.34 |

Table 1 details the shapes and permeance coefficients of Samples 1 to 4 of the experimental example. As illustrated in Table 1, the outer dimensions (length D, width W, height H) of the permanent magnets were as follows. Sample 1: D=about 2.0 mm, W=about 1.0 mm, H=about 0.5 mm. Sample 2: D=about 2.0 mm, W=about 1.6 mm, H=about 0.5 mm. Sample 3: D=about 2.0 mm, W=about 2.4 mm, H=about 0.5 mm. Sample 4: D=about 2.0 mm, W=about 3.0 mm, H=about 0.5 mm.

With these outer dimensions, the permeance coefficients P1 in the magnetization direction 1 of the permanent magnets, which extends along the length directions of the permanent magnets, were Sample 1: about 12.29, Sample 2: about 8.83, Sample 3: about 6.66, and Sample 4: about 5.71, and the permeance coefficients P2 obtained when taking the application direction of the to-be-measured magnetic field 2, which extends in the width direction of the permanent magnets, as the magnetization direction were Sample 1: about 2.95, Sample 2: about 5.55, Sample 3: about 9.75, and Sample 4: about 13.37. Therefore, P2/P1 is about 0.24 for Sample 1, about 0.63 for Sample 2, about 1.46 for Sample 3, and about 2.34 for Sample 4.

TABLE 2

| | Magnetic moment of permanent magnet after magnetization in magnetization direction (emu) | Magnetization strength of permanent magnet in magnetization direction (emu/cm$^3$) | Magnetic moment of permanent magnet in application direction of magnetic field to be measured (emu) | Magnetization strength of permanent magnet in application direction of magnetic field to be measured (emu/cm$^3$) | Ratio of magnetization strength of permanent magnet in application direction of magnetic field to be measured with respect to magnetization strength of permanent magnet in magnetization direction (%) |
|---|---|---|---|---|---|
| Sample 1 | 0.35 | 350.0 | 0.005 | 5.00 | 1.4 |
| Sample 2 | 0.56 | 346.9 | 0.025 | 15.63 | 4.5 |

TABLE 2-continued

|  | Magnetic moment of permanent magnet after magnetization in magnetization direction (emu) | Magnetization strength of permanent magnet in magnetization direction (emu/cm³) | Magnetic moment of permanent magnet in application direction of magnetic field to be measured (emu) | Magnetization strength of permanent magnet in application direction of magnetic field to be measured (emu/cm³) | Ratio of magnetization strength of permanent magnet in application direction of magnetic field to be measured with respect to magnetization strength of permanent magnet in magnetization direction (%) |
|---|---|---|---|---|---|
| Sample 3 | 0.82 | 339.6 | 0.040 | 16.67 | 4.9 |
| Sample 4 | 0.99 | 330.0 | 0.055 | 18.33 | 5.6 |

Table 2 summarizes the magnetic moments and magnetization strengths of the Samples 1 to 4 after the Samples 1 to 4 of the experimental example were magnetized. As illustrated in Table 2, measured values of the magnetic moments of the permanent magnets obtained after the permanent magnets were magnetized in the magnetization direction 1 using a vibrating sample magnetometer (VSM) were Sample 1: about 0.35 emu, Sample 2: about 0.56 emu, Sample 3: about 0.82 emu, and Sample 4: about 0.99 emu, and the magnetization strengths of the permanent magnets in the magnetization direction 1 were Sample 1: about 350.0 emu/cm³, Sample 2: about 346.9 emu/cm³, Sample 3: about 339.6 emu/cm³, and Sample 4: about 330.0 emu/cm³.

After a magnetic field of about 600 mT acting as the to-be-measured magnetic field 2 was applied to the permanent magnets, the measured values of the magnetic moments of the permanent magnets in the application direction of the to-be-measured magnetic field 2 as measured using the VSM were Sample 1: about 0.005 emu, Sample 2: about 0.025 emu, Sample 3: about 0.040 emu, and Sample 4: about 0.055 emu, and the magnetization strengths of the permanent magnets in the application direction of the to-be-measured magnetic field 2 were Sample 1: about 5.00 emu/cm³, Sample 2: about 15.63 emu/cm³, Sample 3: about 16.67 emu/cm³, and Sample 4: about 18.33 emu/cm³.

The ratio of the magnetization strength of the permanent magnets in the application direction of the to-be-measured magnetic field 2 with respect to the magnetization strength of the permanent magnets in the magnetization direction 1 were Sample 1: about 1.4%, Sample 2: about 4.5%, Sample 3: about 4.9%, and Sample 4: about 5.6%.

Figure 4:
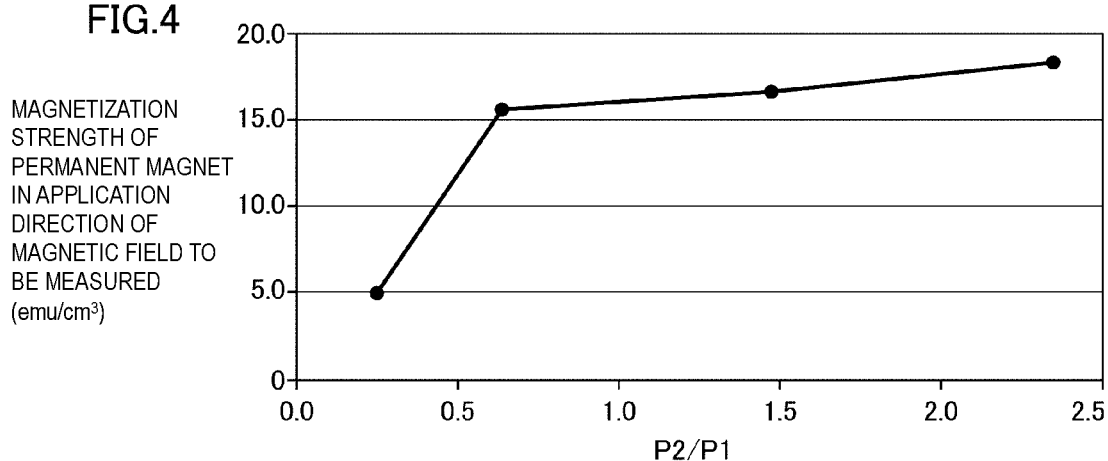
FIG. 4 is a graph illustrating the relationship between P2/P1 and the magnetization strength of a permanent magnet in the application direction of a magnetic field to be measured.
Figure 5:
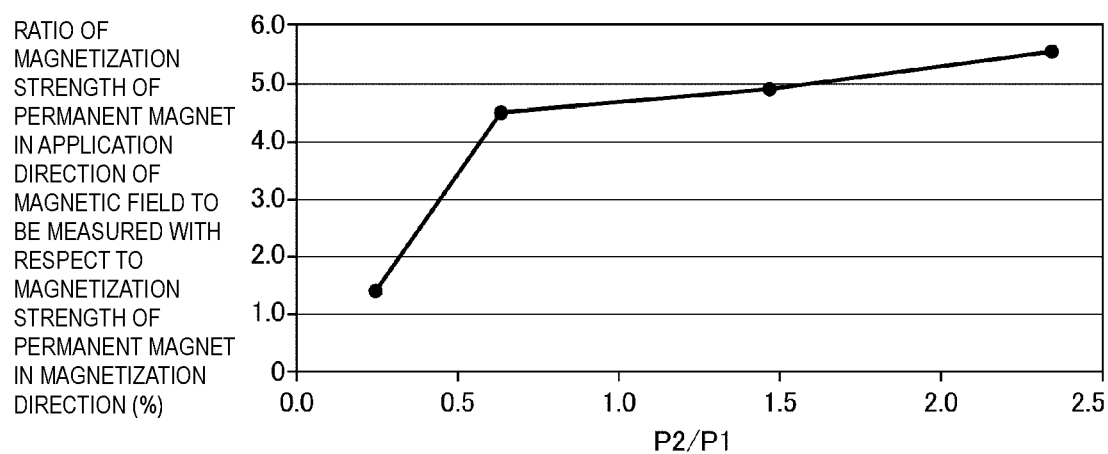
FIG. 5 is a graph illustrating the relationship between P2/P1 and the ratio of the magnetization strength of a permanent magnet in the application direction of a magnetic field to be measured with respect to the magnetization strength of the permanent magnet in the magnetization direction of the permanent magnet.

FIG. 4 is a graph illustrating the relationship between P2/P1 and the magnetization strength of a permanent magnet in the application direction of a magnetic field to be measured. FIG. 5 is a graph illustrating the relationship between P2/P1 and the ratio of the magnetization strength of a permanent magnet in the application direction of a magnetic field to be measured with respect to the magnetization strength of the permanent magnet in the magnetization direction. In FIG. 4, the vertical axis represents the magnetization strength (emu/cm³) of a permanent magnet in the application direction of the magnetic field to be measured, and the horizontal axis represents P2/P1. In FIG. 5, the vertical axis represents the ratio (%) of the magnetization strength of a permanent magnet in the application direction of the magnetic field to be measured with respect to the magnetization strength of the permanent magnet in the magnetization direction of the permanent magnet, and the horizontal axis represents P2/P1.

As illustrated in Table 2 and FIGS. 4 and 5, the rate of increase of the magnetization strength of a permanent magnet in the application direction of the to-be-measured magnetic field 2 decreased and the rate of increase of the ratio of the magnetization strength of a permanent magnet in the application direction of the to-be-measured magnetic field 2 with respect to the magnetization strength of the permanent magnet in the magnetization direction 1 of the permanent magnet decreased when the value of the permeance coefficient P2 obtained by taking the application direction of the to-be-measured magnetic field 2 as the magnetization direction was less than or equal to about 1.5 times the value of the permeance coefficient P1 in the magnetization direction 1 of the permanent magnet. In the case in which this condition is satisfied, the permanent magnet becomes difficult to magnetize in the application direction of the to-be-measured magnetic field 2 and it was confirmed that stability of the magnetic characteristics of the permanent magnet could be secured.

Therefore, it is preferable that the permanent magnet 110 be shaped such that, for example, the value of the permeance coefficient obtained when the application direction of the to-be-measured magnetic field 2 is taken as the magnetization direction be less than or equal to about 1.5 times the value of the permeance coefficient in the magnetization direction 1 of the permanent magnet 110.

Furthermore, as illustrated in Table 2 and FIGS. 4 and 5, the rate of increase of the magnetization strength of a permanent magnet in the application direction of the to-be-measured magnetic field 2 sharply decreased and the rate of increase of the ratio of the magnetization strength of a permanent magnet in the application direction of the to-be-measured magnetic field 2 with respect to the magnetization strength of the permanent magnet in the magnetization direction 1 of the permanent magnet sharply decreased when the value of the permeance coefficient P2 obtained when taking the application direction of the to-be-measured magnetic field 2 as the magnetization direction was less than or equal to about 0.6 times the value of the permeance coefficient P1 in the magnetization direction 1 of the permanent magnet. In the case in which this condition is satisfied, the permanent magnet becomes even harder to magnetize in the application direction of the to-be-measured magnetic field 2 and it was confirmed that stability of the magnetic characteristics of the permanent magnet was secured to a greater degree.

Therefore, it is further preferable that the permanent magnet 110 be shaped such that, for example, the value of the permeance coefficient obtained when taking the application direction of the to-be-measured magnetic field 2 as the magnetization direction be less than or equal to about 0.6 times the value of the permeance coefficient in the magnetization direction 1 of the permanent magnet 110.

Figure 6:
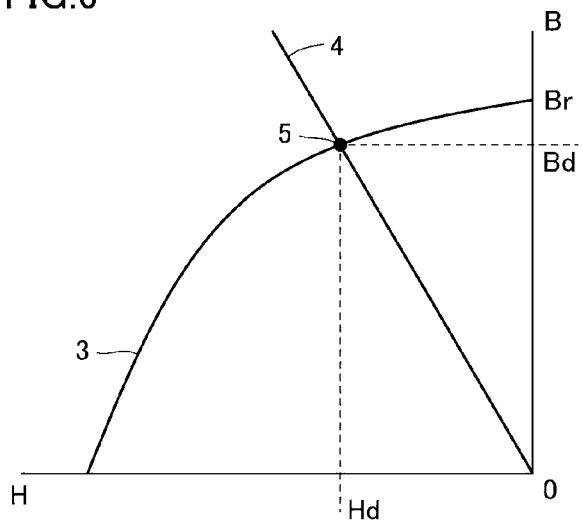
FIG. 6 is a graph illustrating a demagnetization curve and a permeance line of a permanent magnet.

FIG. 6 is a graph illustrating a demagnetization curve and a permeance line of a permanent magnet. In FIG. 6, the vertical axis represents magnetic flux density B and the horizontal axis represents magnetic field strength H.

As illustrated in FIG. 6, at an operation point 5 on a demagnetization curve 3, the strength of the magnetic field is Hd and the magnetic flux density at this time is Bd. The permeance coefficient is expressed by Bd/Hd. A straight line that passes through the origin of the demagnetization curve 3 and the operation point 5 is referred to as a permeance line 4.

In the case in which the permanent magnet 110 has a shape that achieves a permeance coefficient in the magnetization direction 1 that corresponds to the maximum energy product (BHmax) of the demagnetization curve 3 of the permanent magnet 110, the bias magnetic field is able to be effectively applied to the magnetosensitive body 120.

In the case in which the permanent magnet 110 is shaped such that the value of the permeance coefficient in the magnetization direction 1 of the permanent magnet 110 is greater than or equal to the value of the permeance coefficient in the magnetization direction 1 corresponding to the maximum energy product (BHmax) of the demagnetization curve 3 of the permanent magnet 110, the occurrence of an irreversible temperature change in the magnetic characteristics of the permanent magnet 110 known as initial demagnetization is able to be reduced or prevented.

Preferred Embodiment 2

A magnetic sensor according to preferred embodiment 2 of the present invention will be described. A magnetic sensor 200 according to preferred embodiment 2 differs from the magnetic sensor 100 according to preferred embodiment 1 only in terms of the arrangement of the permanent magnets and the magnetosensitive body, and therefore, the portions of the configuration that are the same or substantially the same as in the magnetic sensor 100 according to preferred embodiment 1 are denoted by the same reference symbols and repeated description thereof is omitted.

Figure 7:
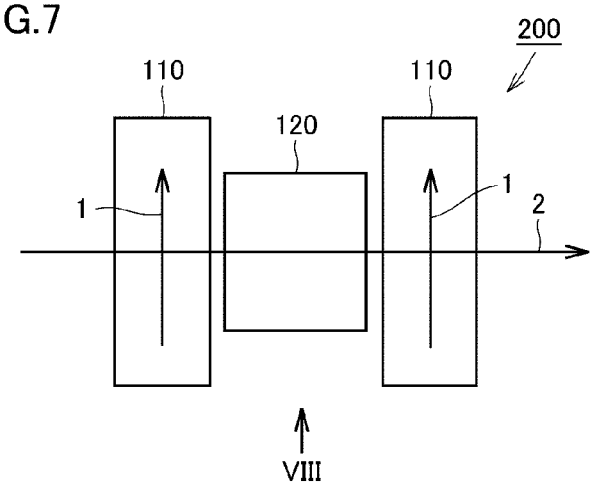
FIG. 7 is a plan view illustrating the configuration of a magnetic sensor according to preferred embodiment 2 of the present invention.
Figure 8:
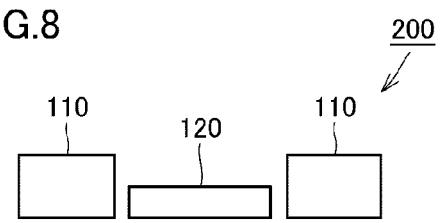
FIG. 8 is a front view of the magnetic sensor illustrated in FIG. 7 seen in the direction of arrow VIII.

FIG. 7 is a plan view illustrating the configuration of a magnetic sensor according to preferred embodiment 2 of the present invention. FIG. 8 is a front view of the magnetic sensor illustrated in FIG. 7 seen in the direction of arrow VIII.

As illustrated in FIGS. 7 and 8, the magnetic sensor 200 according to preferred embodiment 2 of the present invention includes two permanent magnets 110 and one magnetosensitive body 120 that detects the to-be-measured magnetic field 2 in a state in which a bias magnetic field is applied thereto from each of the two permanent magnets 110. In the present preferred embodiment, the two permanent magnets 110 are arrayed in the application direction of the to-be-measured magnetic field 2. The magnetization directions 1 of the two permanent magnets 110 are preferably the same or substantially the same as each other. The magnetosensitive body 120 is provided between the two permanent magnets 110. The two permanent magnets 110 and the magnetosensitive body 120 are mounted on a substrate, which is not illustrated.

The substrate is preferably a printed wiring board, and is made of a base material, such as glass epoxy or alumina, for example, and wiring lines provided by patterning a metal film made of copper or other suitable metal, for example, provided on the surface of the base material.

Each of the two permanent magnets 110 is preferably shaped, for example, such that the value of the permeance coefficient obtained when taking the application direction of the to-be-measured magnetic field 2 as the magnetization direction is less than or equal to the value of the permeance coefficient in the magnetization direction 1 of the permanent magnet 110. Thus, the two permanent magnets 110 are difficult to magnetize in the application direction of the to-be-measured magnetic field 2 and stability of the magnetic characteristics of the two permanent magnets 110 is secured.

Preferred Embodiment 3

Hereafter, a magnetic sensor according to preferred embodiment 3 of the present invention will be described. A magnetic sensor 300 according to preferred embodiment 3 differs from the magnetic sensor 200 according to preferred embodiment 2 only in terms of the magnetization direction of one permanent magnet among the two permanent magnets, and therefore, the portions of the configuration that are the same or substantially the same as in the magnetic sensor 200 according to preferred embodiment 2 are denoted by the same reference symbols and repeated description thereof is omitted.

Figure 9:
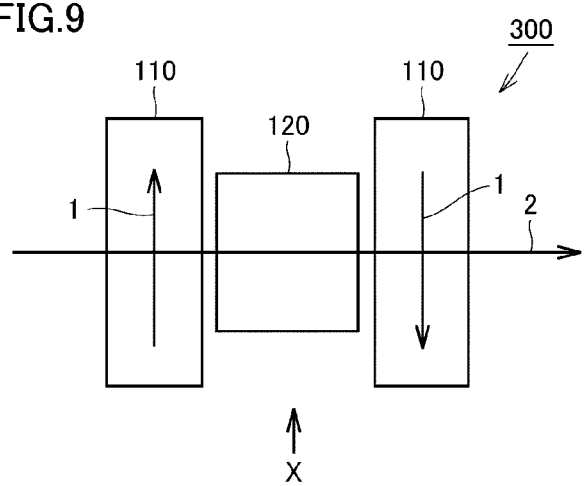
FIG. 9 is a plan view illustrating the configuration of a magnetic sensor according to preferred embodiment 3 of the present invention.
Figure 10:
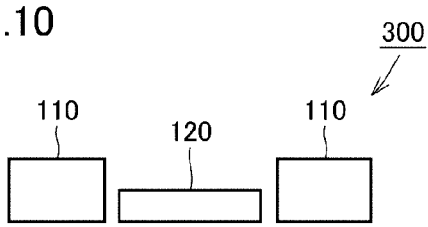
FIG. 10 is a front view of the magnetic sensor illustrated in FIG. 9 seen in the direction of arrow X.

FIG. 9 is a plan view illustrating the configuration of the magnetic sensor according to preferred embodiment 3 of the present invention. FIG. 10 is a front view of the magnetic sensor illustrated in FIG. 9 seen in the direction of arrow X.

As illustrated in FIGS. 9 and 10, the magnetic sensor 300 according to preferred embodiment 3 of the present invention includes two permanent magnets 110 and one magnetosensitive body 120 that detects the to-be-measured magnetic field 2 in a state in which a bias magnetic field is applied thereto from each of the two permanent magnets 110. In the present preferred embodiment, the two permanent magnets 110 are arrayed in the application direction of the to-be-measured magnetic field 2. The magnetization directions 1 of the two permanent magnets 110 preferably extend in opposite directions. The magnetosensitive body 120 is provided between the two permanent magnets 110. The two permanent magnets 110 and the magnetosensitive body 120 are mounted on a substrate, which is not illustrated.

In the present preferred embodiment, the magnetic field applied by one permanent magnet among the two permanent magnets 110 is applied to the other permanent magnet among the two permanent magnets 110 in the magnetization direction of the other permanent magnet. Similarly, the magnetic field applied by the other permanent magnet among the two permanent magnets 110 is applied to the one permanent magnet among the two permanent magnets 110 in the magnetization direction of the one permanent magnet. Thus, the two permanent magnets 110 are difficult to magnetize in the application direction of the to-be-measured magnetic field 2 and stability of the magnetic characteristics of the two permanent magnets 110 is easily secured.

In addition, a magnetic sensor that includes two permanent magnets 110 has been described in the present preferred embodiment, and the magnetic fields of the one permanent magnet and the other permanent magnet are applied in the respective magnetization directions thereof in order to secure stability of the magnetic characteristics of the permanent magnets, but the magnetic sensor may further include other permanent magnets that apply a magnetic field to the one permanent magnet in the magnetization direction of the one permanent magnet and apply a magnetic field to the other permanent magnet in the magnetization direction of the other permanent magnet. Thus, the magnetic sensor may include 3 or more permanent magnets, for example.

Preferred Embodiment 4

Hereafter, a magnetic sensor according to preferred embodiment 4 of the present invention will be described. A magnetic sensor 400 according to preferred embodiment 4 differs from the magnetic sensor 100 according to preferred embodiment 1 only in terms of the arrangement of the permanent magnet and the magnetosensitive bodies, and therefore, the portions of the configuration that are the same or substantially the same as in the magnetic sensor 100 according to preferred embodiment 1 are denoted by the same reference symbols and repeated description thereof is omitted.

Figure 11:
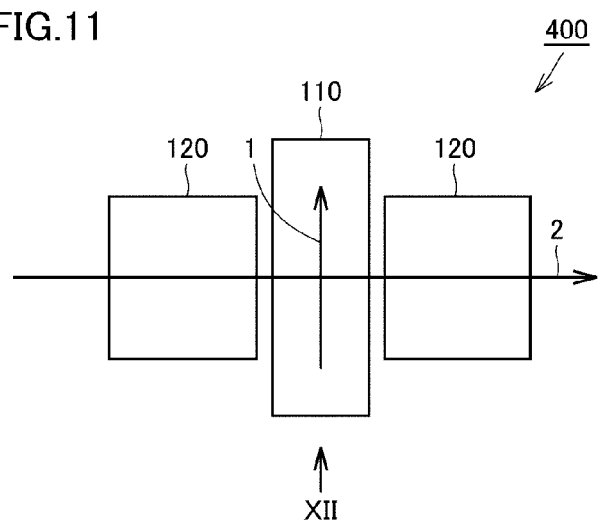
FIG. 11 is a plan view illustrating the configuration of a magnetic sensor according to preferred embodiment 4 of the present invention.
Figure 12:
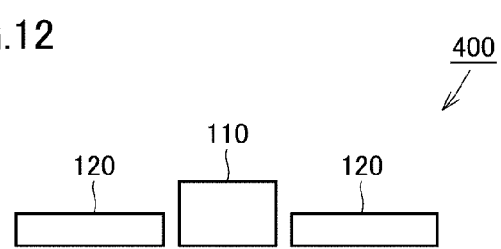
FIG. 12 is a front view of the magnetic sensor illustrated in FIG. 11 seen in the direction of arrow XII.

FIG. 11 is a plan view illustrating the configuration of the magnetic sensor according to preferred embodiment 4 of the present invention. FIG. 12 is a front view of the magnetic sensor illustrated in FIG. 11 seen in the direction of arrow XII.

As illustrated in FIGS. 11 and 12, the magnetic sensor 400 according to preferred embodiment 4 of the present invention preferably includes one permanent magnet 110 and two magnetosensitive bodies 120 that detect the to-be-measured magnetic field 2 in a state in which a bias magnetic field is applied thereto from the one permanent magnet 110. In the present preferred embodiment, the two magnetosensitive bodies 120 are arrayed in the application direction of the to-be-measured magnetic field 2. The permanent magnet 110 is provided between the two magnetosensitive bodies 120. The permanent magnet 110 and the two magnetosensitive bodies 120 are mounted on a substrate, which is not illustrated.

In the magnetic sensor 400 according to the present preferred embodiment, one permanent magnet 110 is shared by two magnetosensitive bodies 120, and therefore, it is even more important that stability of the magnetic characteristics of the permanent magnet 110 be secured.

Preferred Embodiment 5

Hereafter, a magnetic sensor according to preferred embodiment 5 of the present invention will be described. A magnetic sensor 500 according to preferred embodiment 5 differs from the magnetic sensor 200 according to preferred embodiment 2 only in terms of the arrangement of the permanent magnets and the magnetosensitive body, and therefore the portions of the configuration that are the same or substantially the same as in the magnetic sensor 200 according to preferred embodiment 2 are denoted by the same reference symbols and repeated description thereof is omitted.

Figure 13:
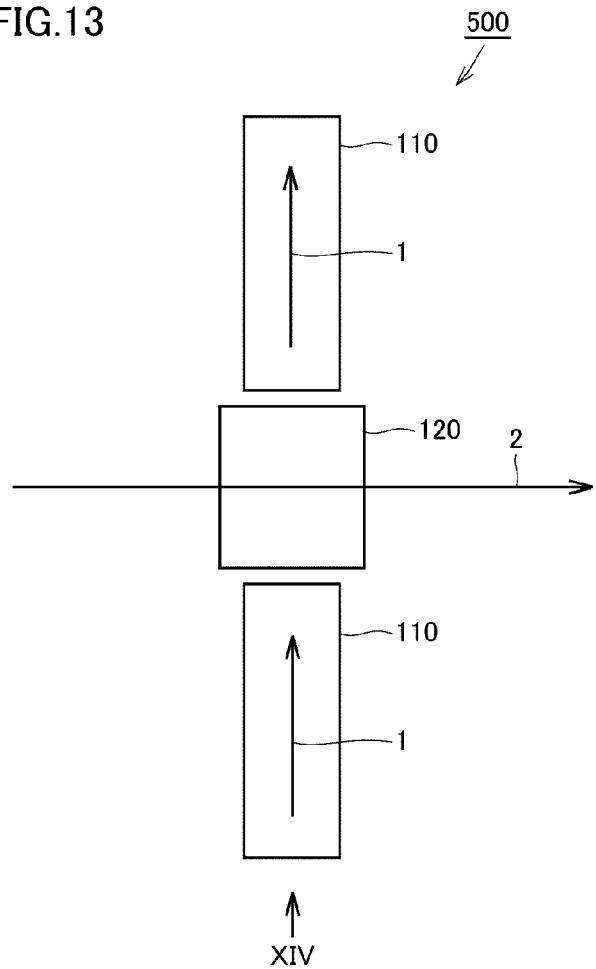
FIG. 13 is a plan view illustrating the configuration of a magnetic sensor according to preferred embodiment 5 of the present invention.
Figure 14:
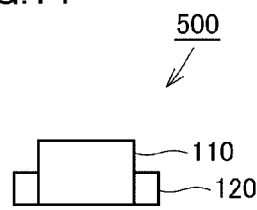
FIG. 14 is a front view of the magnetic sensor illustrated in FIG. 13 seen in the direction of arrow XIV.

FIG. 13 is a plan view illustrating the configuration of the magnetic sensor according to preferred embodiment 5 of the present invention. FIG. 14 is a front view of the magnetic sensor illustrated in FIG. 13 seen in the direction of arrow XIV.

As illustrated in FIGS. 13 and 14, the magnetic sensor 500 according to preferred embodiment 5 of the present invention includes two permanent magnets 110 and one magnetosensitive body 120 that detects the to-be-measured magnetic field 2 in a state in which a bias magnetic field is applied thereto from each of the two permanent magnets 110. In the present preferred embodiment, the two permanent magnets 110 are arrayed along the magnetization direction 1 of the permanent magnets 110. In other words, the two permanent magnets 110 are arrayed in a direction that is perpendicular or substantially perpendicular to the application direction of the to-be-measured magnetic field 2. The magnetization directions 1 of the two permanent magnets 110 are preferably the same as each other. The magnetosensitive body 120 is provided between the two permanent magnets 110. The two permanent magnets 110 and the magnetosensitive body 120 are mounted on a substrate, which is not illustrated.

In the present preferred embodiment, the magnetic field applied by one permanent magnet among the two permanent magnets 110 is applied to the other permanent magnet among the two permanent magnets 110 in the magnetization direction of the other permanent magnet. Similarly, the magnetic field applied by the other permanent magnet among the two permanent magnets 110 is applied to the one permanent magnet among the two permanent magnets 110 in the magnetization direction of the one permanent magnet. Thus, the two permanent magnets 110 are difficult to magnetize in the application direction of the to-be-measured magnetic field 2 and stability of the magnetic characteristics of the two permanent magnets 110 is easily secured.

Preferred Embodiment 6

Hereafter, a magnetic sensor according to preferred embodiment 6 of the present invention will be described. A magnetic sensor 600 according to preferred embodiment 6 differs from the magnetic sensor 200 according to preferred embodiment 2 only in terms of the orientations of the permanent magnets and the magnetosensitive body with respect to the application direction of the to-be-measured magnetic field, and therefore the portions of the configuration that are the same or substantially the same as in the magnetic sensor 200 according to preferred embodiment 2 are denoted by the same reference symbols and repeated description thereof is omitted.

Figure 15:
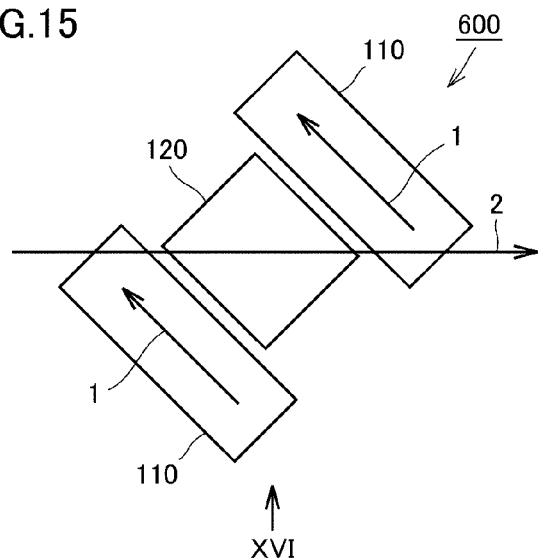
FIG. 15 is a plan view illustrating the configuration of a magnetic sensor according to preferred embodiment 6 of the present invention.
Figure 16:
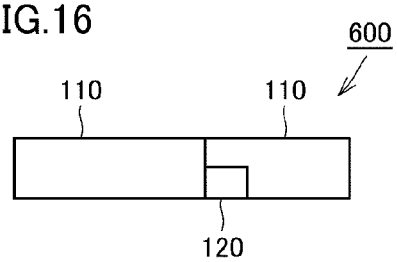
FIG. 16 is a front view of the magnetic sensor illustrated in FIG. 15 seen in the direction of arrow XVI.

FIG. 15 is a plan view illustrating the configuration of the magnetic sensor according to preferred embodiment 6 of the present invention. FIG. 16 is a front view of the magnetic sensor illustrated in FIG. 15 seen in the direction of arrow XVI.

As illustrated in FIGS. 15 and 16, the magnetic sensor 600 according to preferred embodiment 6 of the present invention includes two permanent magnets 110 and one magnetosensitive body 120 that detects the to-be-measured magnetic field 2 in a state in which a bias magnetic field is applied thereto from each of the two permanent magnets 110. In the present preferred embodiment, the two permanent magnets 110 are arrayed in a direction that is slanted with respect to the application direction of the to-be-measured magnetic field 2. The magnetization directions 1 of the two permanent magnets 110 are preferably the same as each other. The magnetosensitive body 120 is provided between the two permanent magnets 110. The two permanent magnets 110 and the magnetosensitive body 120 are mounted on a substrate, which is not illustrated.

Each of the two permanent magnets 110 is preferably shaped such that the value of the permeance coefficient obtained when taking the application direction of the to-be-measured magnetic field 2 as the magnetization direction is less than or equal to the value of the permeance coefficient in the magnetization direction 1 of the permanent magnet 110. Thus, the two permanent magnets 110 are difficult to magnetize in the application direction of the to-be-measured magnetic field 2 and stability of the magnetic characteristics of the two permanent magnets 110 is secured.

Preferred Embodiment 7

Hereafter, a magnetic sensor according to preferred embodiment 7 of the present invention will be described. A magnetic sensor 700 according to preferred embodiment 7 differs from the magnetic sensor 100 according to preferred embodiment 1 only in terms of the arrangement of the permanent magnet and the magnetosensitive body and in that the magnetosensitive body has a half-bridge circuit including two magnetoresistance elements, and therefore the portions of the configuration that are the same or substantially the same as in the magnetic sensor 100 according to preferred embodiment 1 are denoted by the same reference symbols and repeated description thereof is omitted.

Figure 17:
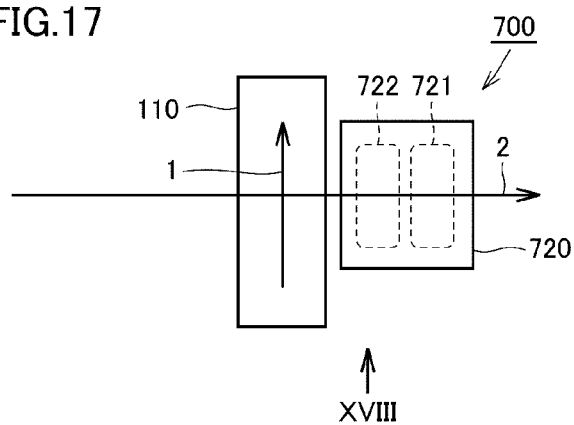
FIG. 17 is a plan view illustrating the configuration of a magnetic sensor according to preferred embodiment 7 of the present invention.
Figure 18:
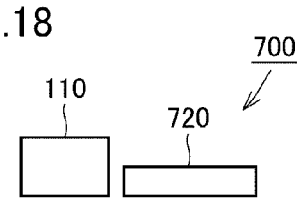
FIG. 18 is a front view of the magnetic sensor illustrated in FIG. 17 seen in the direction of arrow XVIII.

FIG. 17 is a plan view illustrating the configuration of the magnetic sensor according to preferred embodiment 7 of the present invention. FIG. 18 is a front view of the magnetic sensor illustrated in FIG. 17 seen in the direction of arrow XVIII.

As illustrated in FIGS. 17 and 18, the magnetic sensor 700 according to preferred embodiment 7 of the present invention includes a permanent magnet 110 and a magnetosensitive body 720 that detects the to-be-measured magnetic field 2 in a state in which a bias magnetic field is applied thereto from the permanent magnet 110. In the present preferred embodiment, the permanent magnet 110 and the magnetosensitive body 720 are arrayed in the application direction of the to-be-measured magnetic field 2. The permanent magnet 110 and the magnetosensitive body 720 are mounted on a substrate, which is not illustrated.

The magnetosensitive body 720 includes a first magnetoresistance element 721 and a second magnetoresistance element 722. The first magnetoresistance element 721 and the second magnetoresistance element 722 are arrayed in the application direction of the to-be-measured magnetic field 2. The first magnetoresistance element 721 and the second magnetoresistance element 722 are electrically connected to each other and define a half-bridge circuit.

In the magnetic sensor 700 according to the present preferred embodiment, one permanent magnet 110 is shared by the first magnetoresistance element 721 and the second magnetoresistance element 722, and therefore it is even more important that stability of the magnetic characteristics of the permanent magnet 110 be secured.

Preferred Embodiment 8

Hereafter, an electric current sensor according to preferred embodiment 8 of the present invention will be described. An electric current sensor 800 according to preferred embodiment preferably includes the magnetic sensor 400 according to preferred embodiment 4, and therefore the portions of the configuration that are the same or substantially the same as in the magnetic sensor 400 according to preferred embodiment 4 are denoted by the same symbols and repeated description thereof is omitted.

Figure 19:
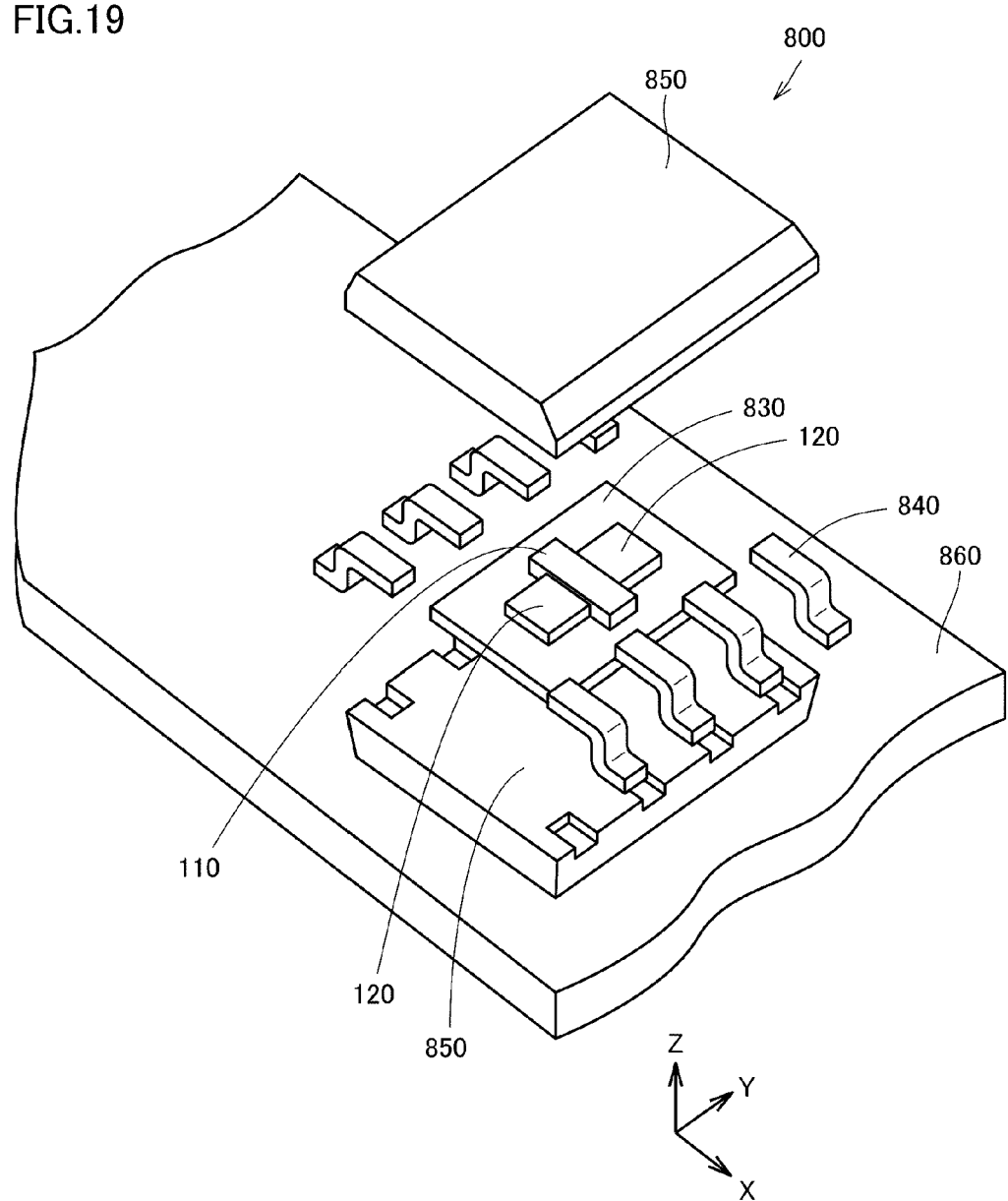
FIG. 19 is an exploded perspective view illustrating the configuration of an electric current sensor according to preferred embodiment 8 of the present invention.

FIG. 19 is an exploded perspective view illustrating the configuration of the electric current sensor according to preferred embodiment 8 of the present invention. In FIG. 19, a length direction of a conductor 860, which will be described later, is depicted as an X axis direction, a width direction of the conductor 860 is depicted as a Y axis direction, and a thickness direction of the conductor 860 is depicted as a Z axis direction.

As illustrated in FIG. 19, the electric current sensor 800 according to preferred embodiment 8 of the present invention includes a flat-plate-shaped conductor 860 in which a current to be measured flows and that has a length direction (X axis direction), and a magnetic sensor that detects a magnetic field to be measured generated as a result of the current to be measured flowing in the conductor 860. The magnetization direction 1 of the permanent magnet 110 of the magnetic sensor is preferably a different direction from a direction that is perpendicular or substantially perpendicular to the length direction (X axis direction). In the present preferred embodiment, the permanent magnet 110 is disposed such that the length direction thereof extends in the length direction of the conductor 860 (X axis direction), and the magnetization direction 1 of the permanent magnet 110 extends in the length direction of the conductor 860 (X axis direction).

The current to be measured flows in the length direction of the conductor 860 (X axis direction), and as a result a magnetic field to be measured is generated, which circulates in a clockwise direction around the conductor 860 according to the corkscrew rule. Thus, the application direction of the magnetic field to be measured with respect to the permanent magnet 110 is perpendicular or substantially perpendicular to a direction that extends along the length direction of the conductor 860 (X axis direction) and extends along the width direction of the conductor 860 (Y axis direction). As a result, the application direction of the magnetic field to be measured is a direction that is perpendicular or substantially perpendicular to the magnetization direction 1 of the permanent magnet 110.

In the present preferred embodiment, the conductor 860 is preferably made of copper, for example. However, the material of the conductor 860 is not limited to this example, and a metal such as silver or aluminum, or an alloy including such a metal may be used.

The conductor 860 may be subjected to a surface treatment. For example, at least one plating layer made of a metal, such as nickel, tin, silver, copper, or other suitable or an alloy including such a metal may be provided on the surface of the conductor 860.

The magnetic sensor of the electric current sensor 800 further includes a lead frame 830 on which the permanent magnet 110 and the two magnetosensitive bodies 120 are mounted, a plurality of leads 840, and a sealing resin 850.

The electric current sensor 800 further includes a calculator, which is not illustrated, that calculates the value of the current to be measured flowing in the conductor 860 by calculating a detection value of one magnetosensitive body among the two magnetosensitive bodies 120 and the detection value of the other magnetosensitive body among the two magnetosensitive bodies 120. In the present preferred embodiment, the calculator is preferably a differential amplifier, for example. The electronic component defining the calculator may be provided on the lead frame 830, or may be provided on a separate substrate from the magnetic sensor. In the case in which the electronic component that defines the calculator is provided on the lead frame 830, a reduction in the detection accuracy of the magnetic sensor caused by variations in the positions of components is able to be reduced or prevented.

In the present preferred embodiment, the detection value of the to-be-measured magnetic field of one magnetosensitive body among the two magnetosensitive bodies 120 and the detection value of the to-be-measured magnetic field of the other magnetosensitive body among the two magnetosensitive bodies 120 have opposite phases from each other. On the other hand, the detection value of one magnetosensitive body of an external magnetic field and the detection value of the other magnetosensitive body of the external magnetic field have the same phase as each other. Thus, the sensitivity with which the magnetic field to be measured is detected by the magnetic sensor is increased while reducing the effect of an external magnetic field.

In order to effectively reduce or prevent magnetic noise from an external magnetic field, it is preferable to make the electromagnetic conversion gains of the magnetosensitive bodies uniform prior to calculation of the detection value of the one magnetosensitive body and the detection value of the other magnetosensitive body by the calculator. Furthermore, it is preferable that the characteristics of the magnetoresistance elements be made uniform by providing the magnetosensitive bodies with resistance adjustment elements, such as trimming resistors and adjusting the resistance values of the magnetoresistance elements.

Generation of signal delay due to induced electromotive force is able to be reduced or prevented and the response characteristics of the magnetic sensor are able to be maintained so as to be high by ensuring that the magnetic flux of the magnetic field to be measured is not perpendicularly or substantially perpendicularly disposed with respect to a circuit pattern provided on the lead frame 830.

The magnetic sensor may be accommodated in a casing. For example, the casing may be made of an engineering plastic, such as polyphenylene sulfide (PPS). PPS has high heat resistance, and therefore is preferably used as the material of the casing when taking into consideration the generation of heat by the conductor 860.

As a method of fixing the substrate and the casing of the magnetic sensor to each other, fastening using screws, thermal welding using a resin, or bonding using an adhesive, for example, may be used. In the case in which the substrate and the casing are fastened to each other using screws, it is preferable that non-magnetic screws be used to ensure that magnetic field disturbance does not occur. The casing may be integrated with the conductor 860, or the casing may be attachable to and detachable from the conductor 860.

The magnetic sensor may be covered by a magnetic shield. The magnetic shield would preferably be made of a magnetic material such as silicon steel, ferrite, or permalloy, for example. The magnetic shield may be integrated with the casing through insert molding.

The electric current sensor 800 according to the present preferred embodiment may be applied to three-phase three-line wiring of an inverter, for example. In this case, space is able to be saved by combining the substrate and casing of the magnetic sensor with each other.

Stability of the magnetic characteristics of the permanent magnet 110 of the magnetic sensor is secured in the electric current sensor 800 according to the present preferred embodiment, and therefore a reduction in the detection accuracy of the electric current sensor 800 is reduced or prevented.

The configurations in the above description of the preferred embodiments may be combined with each other.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A magnetic sensor that measures a strength of a magnetic field to be measured, the magnetic sensor comprising:
   at least one permanent magnet; and
   at least one magnetosensitive body that detects the magnetic field to be measured in a state in which a bias magnetic field is applied thereto from the permanent magnet; wherein
   the permanent magnet is shaped such that a value of a permeance coefficient obtained when taking an application direction of the magnetic field to be measured as a magnetization direction is less than or equal to about 1.5 times a value of a permeance coefficient in a magnetization direction of the permanent magnet.

2. The magnetic sensor according to claim 1, wherein the permanent magnet is shaped such that the value of the permeance coefficient obtained when taking the application direction of the magnetic field to be measured as the magnetization direction is less than or equal to the value of the permeance coefficient in the magnetization direction of the permanent magnet.

3. The magnetic sensor according to claim 2, wherein the permanent magnet is shaped such that the value of the permeance coefficient obtained when taking the application direction of the magnetic field to be measured as the magnetization direction is less than or equal to about 0.6 times the value of the permeance coefficient in the magnetization direction of the permanent magnet.

4. The magnetic sensor according to claim 1, wherein the permanent magnet is shaped such that the value of the permeance coefficient in the magnetization direction of the permanent magnet is larger than about 2.

5. The magnetic sensor according to claim 1, wherein the permanent magnet is shaped such that the value of the permeance coefficient in the magnetization direction of the permanent magnet is greater than or equal to a value of a permeance coefficient in a magnetization direction corresponding to a maximum energy product of a demagnetization curve of the permanent magnet.

6. The magnetic sensor according to claim 1, wherein the at least one permanent magnet includes a plurality of permanent magnets;
   magnetic fields applied from a group of the permanent magnets among the plurality of permanent magnets are applied to remaining permanent magnets among the plurality of permanent magnets in the magnetization directions of the remaining permanent magnets; and
   magnetic fields applied from the remaining permanent magnets to the group of the permanent magnets are applied in the magnetization directions of the group of the permanent magnets.

7. The magnetic sensor according to claim 1, wherein
   the at least one permanent magnet includes two permanent magnets;
   the at least one magnetosensitive body includes only a single magnetosensitive body; and
   the two permanent magnets are arrayed in the application direction of the magnetic field to be measured.

8. The magnetic sensor according to claim 7, wherein the magnetization directions of the two permanent magnets are the same or substantially the same.

9. The magnetic sensor according to claim 7, wherein the magnetization directions of the two permanent magnets are in opposite directions.

10. An electric current sensor comprising:
    a conductor in which a current to be measured flows and that has a length direction; and
    the magnetic sensor according to claim 1 that detects the magnetic field to be measured generated as a result of the current to be measured flowing in the conductor.

11. The electric current sensor according to claim 10, wherein the magnetization direction of the permanent magnet extends in the length direction.

12. The electric current sensor according to claim 10, wherein the permanent magnet is shaped such that the value of the permeance coefficient obtained when taking the application direction of the magnetic field to be measured as the magnetization direction is less than or equal to the value of the permeance coefficient in the magnetization direction of the permanent magnet.

13. The electric current sensor according to claim 12, wherein the permanent magnet is shaped such that the value of the permeance coefficient obtained when taking the application direction of the magnetic field to be measured as the magnetization direction is less than or equal to about 0.6 times the value of the permeance coefficient in the magnetization direction of the permanent magnet.

14. The electric current sensor according to claim 10, wherein the permanent magnet is shaped such that the value of the permeance coefficient in the magnetization direction of the permanent magnet is larger than about 2.

15. The electric current sensor according to claim 10, wherein the permanent magnet is shaped such that the value of the permeance coefficient in the magnetization direction of the permanent magnet is greater than or equal to a value of a permeance coefficient in a magnetization direction corresponding to a maximum energy product of a demagnetization curve of the permanent magnet.

16. The electric current sensor according to claim 10, wherein the at least one permanent magnet includes a plurality of permanent magnets;

magnetic fields applied from a group of the permanent magnets among the plurality of permanent magnets are applied to remaining permanent magnets among the plurality of permanent magnets in the magnetization directions of the remaining permanent magnets; and magnetic fields applied from the remaining permanent magnets to the group of the permanent magnets are applied in the magnetization directions of the group of the permanent magnets.

17. The electric current sensor according to claim 10, wherein
   the at least one permanent magnet includes two permanent magnets;
   the at least one magnetosensitive body includes only a single magnetosensitive body; and
   the two permanent magnets are arrayed in the application direction of the magnetic field to be measured.

18. The electric current sensor according to claim 17, wherein the magnetization directions of the two permanent magnets are the same or substantially the same.

19. The electric current sensor according to claim 17, wherein the magnetization directions of the two permanent magnets are in opposite directions.

* * * * *